United States Patent
Foote et al.

(10) Patent No.: US 6,168,993 B1
(45) Date of Patent: Jan. 2, 2001

(54) PROCESS FOR FABRICATING A SEMICONDUCTOR DEVICE HAVING A GRADED JUNCTION

(75) Inventors: David K. Foote, San Jose; Bharath Rangarajan, Santa Clara; George Kluth, Sunnyvale; Fei Wang, San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/487,922

(22) Filed: Jan. 19, 2000

(51) Int. Cl.$^7$ .............................................. H01L 21/8247
(52) U.S. Cl. ........................................... 438/262; 438/527
(58) Field of Search ................................... 438/257–267, 438/527

(56) References Cited

U.S. PATENT DOCUMENTS 3,997,367 * 12/1976 Yau .
4,818,715 * 4/1989 Chao .
4,837,180 * 6/1989 Chao .

* cited by examiner

Primary Examiner—Richard Booth
(74) Attorney, Agent, or Firm—Brinks Hofer Gilson & Lione

(57) ABSTRACT

A process for fabricating a semiconductor device includes the step of processing a patterned resist layer to vary the lateral dimensions of the patterned resist layer while forming doped regions in a semiconductor substrate. A graded junction profile is formed by creating a patterned resist layer having a first substantially vertical edge surface. A doping process is carried out to form a first doped region in the semiconductor substrate having a junction profile substantially continuous with the first substantially vertical edge surface. The patterned resist layer is processed to form a second substantially vertical edge surface, which is laterally displaced from the first substantially vertical edge surface. A doping process is carried out to form a second doped region having a junction profile that is substantially continuous with the second substantially vertical edge surface. The junction profiles of the first and second doped regions form a graded junction within the semiconductor substrate. The process can be repeated to form a wide variety of graded junction profiles within a semiconductor substrate.

21 Claims, 2 Drawing Sheets

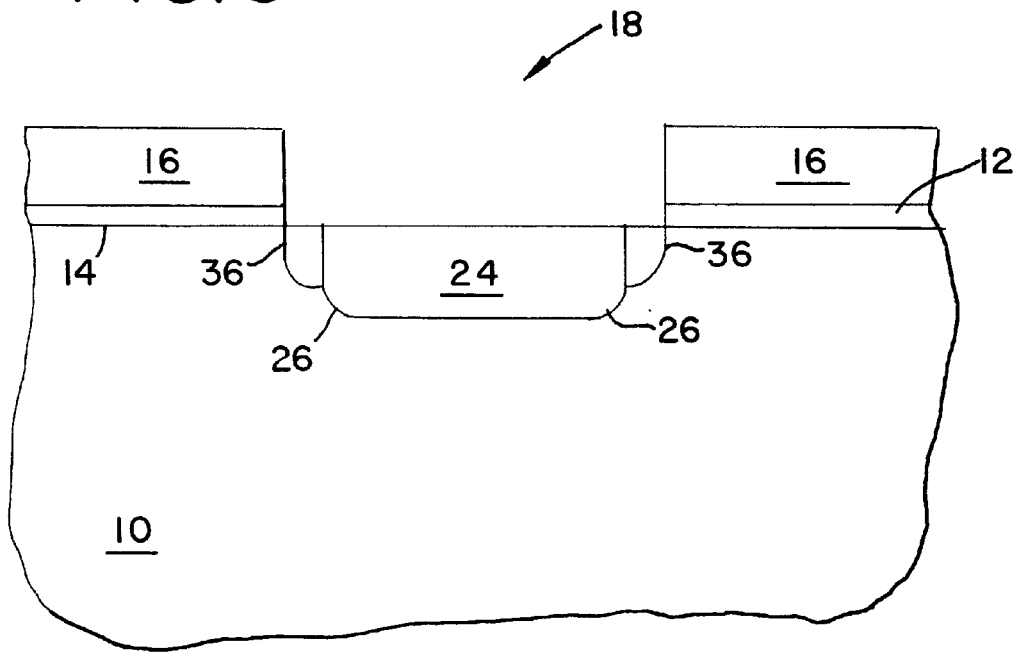
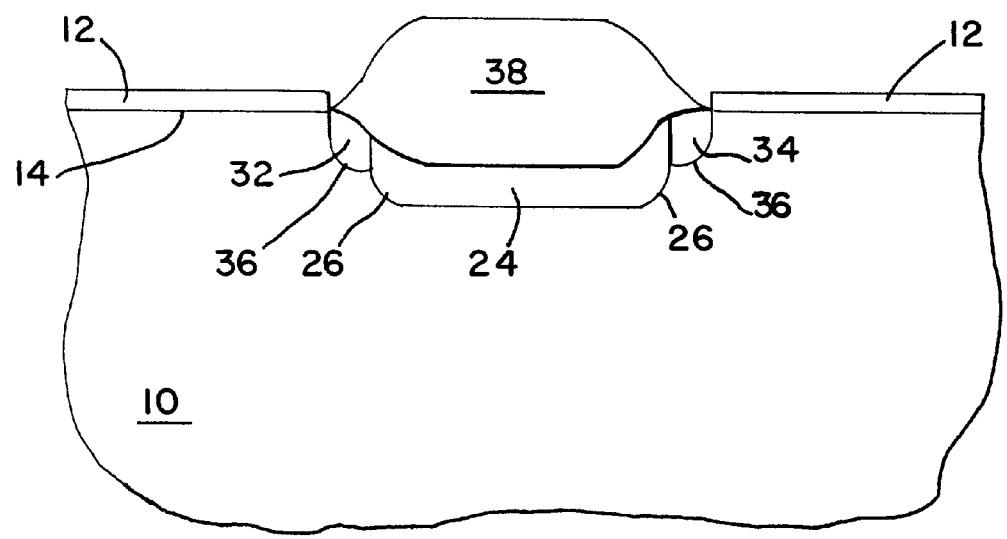

PROCESS FOR FABRICATING A SEMICONDUCTOR DEVICE HAVING A GRADED JUNCTION

CROSS REFERENCE TO RELATED APPLICATION

Related subject matter is disclosed in co-pending, commonly assigned patent application, "PROCESS FOR FABRICATING AN EEPROM DEVICE HAVING A POCKET SUBSTRATE REGION," filed on even date herewith.

FIELD OF THE INVENTION

This invention relates, generally, to a process for fabricating semiconductor devices and, more particularly, to processes for fabricating multiple doped regions in semiconductor devices, such as pocket regions in EEPROM devices.

BACKGROUND OF THE INVENTION

During semiconductor fabrication, numerous doped regions are formed in a semiconductor substrate. These doped regions perform various functions, such as source and drain regions for metal-oxide-semiconductor (MOS) transistors, buried electrical signal lines, substrate resistors and the like. Often, it is necessary to form doped regions having varying junction depths in order to meet the different electrical resistance requirements and current handling requirements of a semiconductor device. Because of the electrical field created by a buried junction, the geometric profile of the junction can be important where electric components having extremely small feature size are being fabricated. For example, a lightly-doped-drain (LDD) structure in the channel region of an MOS transistor are necessary to insure proper functioning of a sub-micron transistor. Additionally, in advanced electrically-erasable-programmable-read-only-memory (EEPROM) devices, pocket regions must be fabricated in a semiconductor substrate having a precise junction profile within the substrate.

Product development efforts in EEPROM device technology have focused on increasing the programming speed, lowering programming and reading voltages, increasing data retention time, reducing cell erasure times and reducing cell dimensions. EEPROM device designers have taken advantage of the ability of silicon nitride to store charge in localized regions and have designed memory circuits that utilize two regions of stored charge within an oxide-nitride-oxide (ONO) layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions. The two-bit memory cell requires pocket regions adjacent to a buries bit-line region. Electrons are sourced from the pocket regions and injected into the silicon nitride layer.

As advanced MOS and EEPROM devices are scaled to smaller dimensions, it becomes more difficult to form the doped regions at precise locations in the substrate. In particular, the pocket regions of EEPROM arrays using two-bit data storage and the LDD regions of MOS transistors must be carefully fabricated to avoid excessive overlap with the source and drain regions. Accordingly, as device dimensions are scaled to smaller values, advances in fabrication technology are necessary to insure proper functioning devices.

BRIEF SUMMARY OF THE INVENTION

A process for fabricating a semiconductor device advantageously enables the formation of a graded junction in a semiconductor substrate. In particular, the process of the invention can be used for the formation of pocket regions in an EEPROM device by carrying out a doping step at an angle of incidence normal to the substrate surface. The ability to form pocket regions at normal angles of incidence enables the formation of pocket regions having precisely determined junction profiles. Additionally, the pocket regions, in combination with a buried bit-line region, create a graded junction within the semiconductor substrate. Improved functionality in EEPROM devices is realized by forming a graded junction in the bit-line region in accordance with the present invention.

In one form, the process of the present invention includes providing a semiconductor substrate having a principal surface. A patterned resist layer is formed overlying the principal surface. The patterned resist layer has a substantially vertical edge surface. The semiconductor substrate is doped using the patterned resist layer to form a first doped region in the substrate. The first doped region has a junction profile substantially continuous with the first substantially vertical edge surface. The patterned resist layer is then processed to form a second substantially vertical edge surface, which is laterally displaced from the first substantially vertical edge surface. A portion of the principal surface of the semiconductor substrate separates the first substantially vertical edge surface from the second substantially vertical edge surface. The patterned resist layer is then used to form a second doped region in the substrate. The second doped region has a junction profile substantially continuous with the second substantially vertical edge surface.

BRIEF DESCRIPTION OF THE DRAWINGS

FIGS. 1–4 illustrate, in cross-section, processing steps in accordance with one embodiment of the invention.

Figure 1:
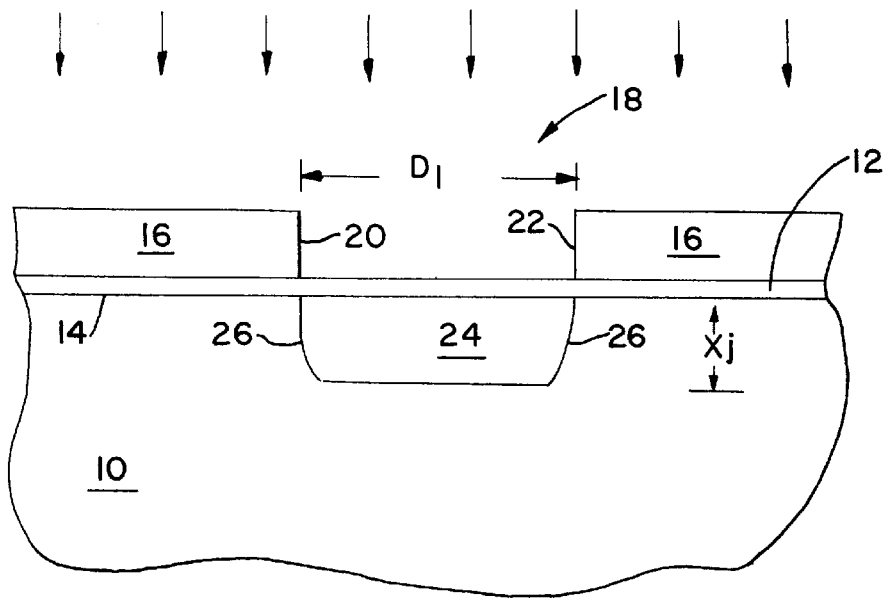

It will be appreciated that, for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

FIG. 1 illustrates, in cross-section, a portion of a semiconductor substrate 10 having already undergone several processing steps in accordance with the invention. A dielectric layer 12 overlies a principal surface 14 of semiconductor substrate 10. Within the context of the present embodiment, dielectric layer 12 can be any dielectric material capable of resisting thermal oxidation. Preferably, dielectric layer 12 contains silicon nitride. For example, dielectric layer 12 can be a silicon nitride layer or a composite dielectric layer including silicon dioxide and silicon nitride.

A patterned resist layer 16 overlies dielectric layer 12. Patterned resist layer 16 includes an opening 18 exposing a portion of dielectric layer 12. Opening 18 is characterized by a first lateral dimension $D_1$. Patterned resist layer 16 includes first substantially vertical edge surfaces 20 and 22, which define the sidewalls of opening 18.

Within the context of the present embodiment, patterned resist layer 16 can be formed by a number of conventional resist materials, including optical photo resist, deep UV-resist, X-ray resist and the like. Preferably, patterned resist layer 16 is formed by depositing a layer of optical photo resist onto dielectric layer 12. The photo resist is then exposed to a predetermined wavelength of optical radiation through a masking reticule, and developed in a conventional developing solution to form opening 18.

After forming opening 18, a doping process is carried out to form a buried bit-line region 24 in semiconductor substrate 10. The doping process is carried out using patterned resist layer 16 as a doping mask. Buried bit-line region 24 has a junction profile 26 that is substantially continuous with first and second edge surfaces 20 and 22. Further, buried bit-line region 24 is characterized by a junction depth $X_{j1}$.

Preferably, buried bit-line region 24 is formed by ion implantation of an n-type dopant, such as arsenic, phosphorous and the like. Alternatively, other doping processes can be carried out to form buried bit-line region 24. For example, molecular beam ion implantation, plasma induced ion deposition and the like can be used.

Figure 2:
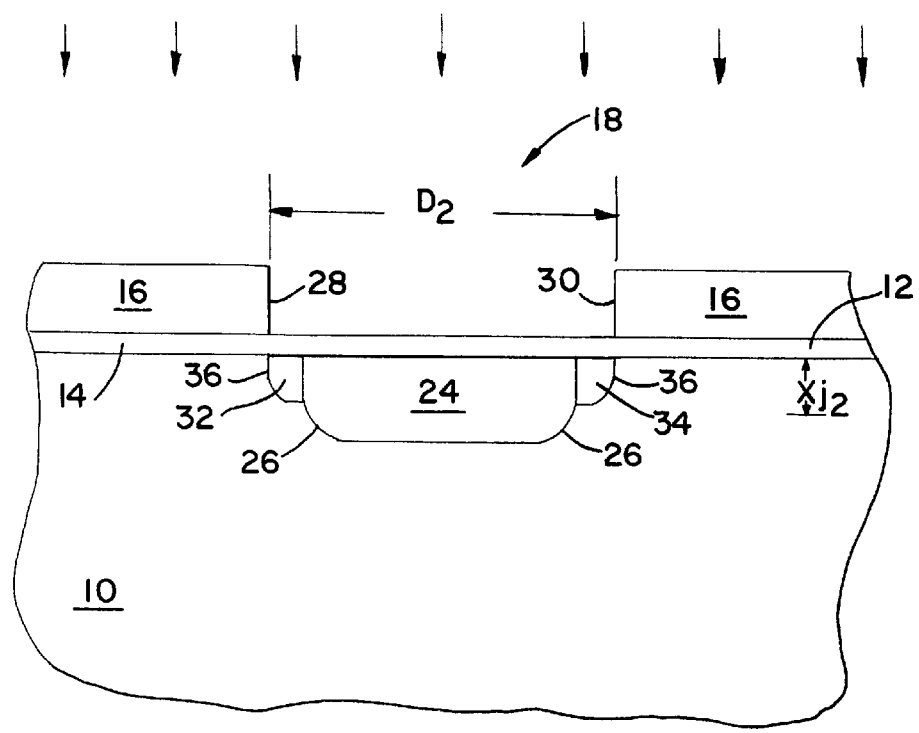

After forming buried bit-line region 24, processing is carried out to form second substantially vertical edge surfaces 28 and 30 in patterned resist layer 16, as illustrated in FIG. 2. Preferably, second substantially vertical edge surfaces 28 and 30 are formed by isotropically etching patterned resist layer 16. During the isotropically etching process, all surfaces of patterned resist layer 16 are etched at approximately the same etch rate. Accordingly, the same quantity of resist material is removed from all surfaces of patterned resist layer 16. In a preferred embodiment, the isotropic etching process is carried out by plasma etching using a mixture of oxygen and nitrogen etching gases. In an alternate method, either oxygen or nitrogen can be used to carry out the isotropic etching process. Those skilled in the art will appreciate that various methods for isotropically etching patterned resist layer 16 exist depending upon the particular material composition of patterned resist layer 16. Accordingly, all such etching methods are within the scope of the present invention.

After processing patterned resist layer 16, opening 18 is characterized by a lateral dimension $D_2$. The magnitude of the dimension $D_2$ is greater than the magnitude of the dimension $D_1$. Accordingly, after processing patterned resist layer 16, a greater portion of dielectric layer 12 is exposed by opening 18.

Next, a doping process is carried out to form pocket regions 32 and 34 in semiconductor substrate 10. Pocket regions 32 and 34 have a junction profile 36 that is substantially continuous with second substantially vertical edge surfaces 28 and 30. Additionally, pocket regions 32 and 34 are characterized by a junction depth $X_{j2}$. The junction $X_{j2}$ of pocket regions 32 and 34 is less than the junction depth $X_{j1}$ of buried bit-line region 24.

Those skilled in the art will recognize that junction profile 26, in combination with junction profile 36, can be characterized as a graded junction within the semiconductor substrate 10. It is also apparent from the foregoing description that additional processing of patterned resist layer 16 can be carried out to further increase the lateral dimension of opening 18, followed by the formation of additional doped regions within semiconductor substrate 10. Depending upon the particular junction depth of the additional doped regions, various graded junction profiles can be formed by the process of the present invention. Accordingly, all such variations in graded junction profiles are within the scope of the present invention.

In a preferred embodiment of the invention, pocket regions 32 and 34 are formed by ion implantation of boron. A particular advantage of the present embodiment includes the ability to form pocket regions 32 and 34 by implanting boron ions at a normal angle of incidence with respect to principal surface 14. By carrying out the ion implantation step at normal angle of incidence, junction profile 36 can be precisely formed in semiconductor substrate 10 relative to junction profile 36 of buried bit-line region 24. Additionally, the junction depth $X_{j2}$ of pocket regions 32 and 34 can be precisely controlled. Those skilled in the art will recognize that a particular advantage exists in the present invention as compared to the large angle of incidence used by prior art methods for the formation of pocket implant regions.

The process of the present embodiment continues with the removal of portions of dielectric layer 12 exposed by opening 18, as illustrated in FIG. 3. Preferably, dielectric layer 12 is anisotropically etched using patterned resist layer 16 as an etching mask. The anisotropically etching process selectively removes the material of dielectric layer 12 while not substantially etching semiconductor substrate 10 at principal surface 18. Those skilled in the art will recognize that, depending upon the particular material forming dielectric layer 12, various etching methods can be used to anisotropically etch dielectric layer 12. For example, where dielectric layer 12 is a layer of silicon nitride, fluorine based etching chemistry can be used in a reactive-ion-etching (RIE) etching apparatus. Correspondingly, where dielectric layer 12 is a composite material, such as ONO, sequential silicon oxide and silicon nitride etching processes can be used to anisotropically etch dielectric layer 12.

Referring to FIG. 4, after etching dielectric layer 12, patterned resist layer 16 is removed, and an oxidation process is carried out to form a bit-line oxide region 38. Bit-line oxide region 38 overlies buried bit-line region 24 and portions of pocket regions 32 and 34. Preferably, bit-line oxide region 38 is formed by thermally oxidizing semiconductor substrate 10 using dielectric layer 12 as an oxidation mask. Because dielectric layer 12 is resistant to thermal oxidation, the portions of principal surface 14 underlying dielectric layer 12 are not oxidized. Those skilled in the art will recognize that further processing steps can be carried out to complete the fabrication of an EEPROM device. Those processing steps include formation of a control gate electrode, and additional transistors necessary for the functioning of an EEPROM memory cell.

Those skilled in the art will appreciate that structures other than buried bit-line regions and pocket regions can be formed by the process of the present invention. For example, LDD regions can be formed in an MOS transistor following substantially the same procedures described above. Additionally, other substrate structures, such as buried resistors and the like, can also be formed by the method of the present invention. Thus, it is apparent that there has been described a process for fabricating a semiconductor device having a graded junction that fully provides the advantages set forth above. Although particular embodiments of the invention have been described in the foregoing description, it will be apparent to one skilled in the art that numerous modifications and variations can be made without departing from the spirit and scope of the invention. For example, various etching processes, such as magnetically enhanced reactive ion etching, and the like, can be used. Furthermore, various resist materials, such as amplified resist and composite resist, and the like, can be used. Accordingly, all such variations and modifications are within the scope of the appended claims and equivalents thereof.

What is claimed is:

1. A process for fabricating an EEPROM device comprising the steps of:

providing a semiconductor substrate having an oxide layer thereon;

forming a masking pattern overlying the oxide layer, the masking pattern having an opening therein, wherein the opening has a first lateral dimension;

doping the semiconductor substrate using the masking pattern as a doping mask to form a buried bit-line region in the semiconductor substrate;

increasing the first lateral dimension of the opening in the masking pattern to a second lateral dimension;

wherein the second lateral dimension is greater than the first lateral dimension; and doping the semiconductor substrate using hte masking pattern as a doping mask to form pocket regions in the semiconductor substrate adjacent to the buried bit-line region.

2. The process of claim 1, wherein the step of doping the semiconductor substrate to form pocket regions comprises ion implantation at an angle of incidence normal to a principle surface of the semiconductor substrate.

3. The process of claim 2, wherein the ion implantation comprises boron ion implantation.

4. The process of claim 1, wherein the step of forming a masking pattern comprises forming a photoresist pattern.

5. The process of claim 4, wherein the step of increasing the first lateral dimension comprises isotropic etching of the photoresist pattern.

6. The process of claim 5, wherein the step of increasing the first lateral dimension of the masking pattern comprises carrying out a plasma resist trimming process.

7. The process of claim 6, wherein the plasma resist trimming process comprises isotropic plasma etching using a mixture of oxygen and nitrogen etching gas.

8. The process of claim 1 further comprising oxidizing the semiconductor substrate to form a bit-line oxide region overlying the buried bit-line region.

9. A process for fabricating an semiconductor device comprising the steps of:

providing a semiconductor substrate having a principal surface;

forming a patterned resist layer overlying the principal surface, wherein the patterned resist layer includes a first substantially vertical edge surface;

doping the semiconductor substrate using the patterned resist layer to form a buried bit-line including a first doped region having a junction profile substantially continuous with the first substantially vertical edge surface;

processing the patterned resist layer to form a second substantially vertical edge surface laterally displaced from the first substantially vertical edge surface, wherein a portion of the principal surface separates the first edge surface from the second edge surface; and doping the semiconductor substrate using the patterned resist layer to form a second doped region having a junction profile substantially continuous with the second substantially vertical edge surface.

10. The process of claim 9 further comprising forming a dielectric layer overlying the principal surface.

11. The process of claim 10, wherein the step of forming a patterned resist layer comprises forming a photoresist layer overlying the dielectric layer.

12. The process of claim 11, wherein the step of processing the resist layer comprises plasma etching.

13. The process of claim 10, wherein the step of forming a dielectric layer comprises forming an ONO dielectric layer including a first dielectric layer, a silicon nitride layer overlying the first dielectric layer, and a second dielectric layer overlying the silicon nitride layer.

14. The process of claim 10, wherein the step of forming a dielectric layer comprises forming an ONO layer overlying the principal surface and forming the patterned resist layer overlying the ONO layer.

15. The process of claim 14, wherein the step of doping the semiconductor substrate using the patterned resist layer to form a second doped region comprises boron ion implantation at an angle of incidence normal to the principal surface of the semiconductor substrate.

16. The process of claim 9, wherein the step of forming the first doped region comprises forming a doped region having a first junction depth, and wherein the step of forming the second doped region comprises forming a doped region having a junction depth, and wherein the second junction depth is less than the first junction depth.

17. A process for fabricating an EEPROM device comprising the steps of:

providing a semiconductor substrate having a principal surface;

forming an ONO layer overlying the principal surface;

forming a patterned resist layer overlying the ONO layer, wherein the patterned resist layer has an opening characterized by a first lateral dimension;

implanting dopant atoms to form a buried bit-line region using the patterned resist layer as a doping mask;

trimming the patterned resist layer to increase the first lateral dimension of the opening;

implanting dopant atoms through the ONO layer to form pocket implant regions in the semiconductor substrate; and oxidizing the semiconductor substrate to form a bit-line oxide region overlying the buried-line region.

18. The process of claim 17, wherein the step of trimming the resist layer comprises isotropically etching the resist layer.

19. The process of claim 17, wherein the step of forming a patterned composite layer comprises forming a photoresist layer overlying the ONO layer, and wherein the step of isotropically etching comprises plasma etching using a mixture of oxygen and nitrogen etching gas.

20. The process of claim 17, wherein the step of forming the buried bit-line region comprises forming a doped region having a first junction depth, and wherein the step of forming the second doped region comprises forming pocket regions having a second junction depth, and wherein the second junction depth is less than the first junction depth.

21. The process of claim 20, wherein the step of forming pocket regions comprises boron implantation at an angle of incidence normal to the principal surface of the semiconductor substrate.

* * * * *

UNITED STATES PATENT AND TRADEMARK OFFICE
CERTIFICATE OF CORRECTION

PATENT NO. : 6,168,993 B1      Page 1 of 1
DATED : January 2, 2001
INVENTOR(S) : David K. Foote et al.

It is certified that error appears in the above-identified patent and that said Letters Patent is hereby corrected as shown below:

<u>Column 5, claim 1,</u>
Line 22, change "hte" to -- the --.

<u>Column 5, claim 2,</u>
Line 29, change "principle" to -- principal --.

<u>Column 5, claim 9,</u>
Line 46, change "an" to -- a --.

Signed and Sealed this

Sixteenth Day of October, 2001

Attest:

NICHOLAS P. GODICI
*Attesting Officer*     *Acting Director of the United States Patent and Trademark Office*